United States Patent
Withey et al.

(10) Patent No.: US 8,961,858 B2
(45) Date of Patent: Feb. 24, 2015

(54) MANUFACTURE OF FIELD ACTIVATED COMPONENTS BY STEREOLITHOGRAPHY

(75) Inventors: Paul Anthony Withey, Derby (GB); Max Eric Schlienger, Napa, CA (US)

(73) Assignee: Rolls-Royce Corporation, Indianapolis, IN (US)

( * ) Notice: Subject to any disclaimer, the term of this patent is extended or adjusted under 35 U.S.C. 154(b) by 1191 days.

(21) Appl. No.: 12/386,168

(22) Filed: Apr. 14, 2009

(65) Prior Publication Data
US 2009/0261287 A1 Oct. 22, 2009

Related U.S. Application Data

(60) Provisional application No. 61/124,046, filed on Apr. 14, 2008.

(51) Int. Cl.
| | | |
|---|---|---|
| *B29C 35/08* | (2006.01) | |
| *B29C 41/02* | (2006.01) | |
| *B29C 70/88* | (2006.01) | |
| *B29C 67/00* | (2006.01) | |
| *H01L 41/47* | (2013.01) | |
| *H01L 41/37* | (2013.01) | |
| *B29K 105/16* | (2006.01) | |
| *H01F 1/055* | (2006.01) | |

(52) U.S. Cl.
CPC ............. *B29C 70/88* (2013.01); *B29C 67/0081* (2013.01); *B29C 67/0066* (2013.01); *B29C 67/0062* (2013.01); *B29K 2105/167* (2013.01); *B29K 2995/0008* (2013.01); *H01F 1/0558* (2013.01); *H01L 41/47* (2013.01); *H01L 41/37* (2013.01)

USPC .......................................... 264/401; 264/437

(58) Field of Classification Search
USPC .................................................. 264/401, 437
See application file for complete search history.

(56) References Cited

U.S. PATENT DOCUMENTS

| | | | |
|---|---|---|---|
| 5,545,367 A | 8/1996 | Bae et al. | |
| 5,796,207 A * | 8/1998 | Safari et al. | ................... 310/358 |
| 5,818,149 A | 10/1998 | Safari et al. | |
| 5,980,813 A | 11/1999 | Narang et al. | |
| 5,997,795 A | 12/1999 | Danforth et al. | |
| 6,049,160 A * | 4/2000 | Safari et al. | ................... 310/369 |
| 6,117,385 A | 9/2000 | Chartoff et al. | |
| 6,283,997 B1 * | 9/2001 | Garg et al. | ................. 623/16.11 |

(Continued)

FOREIGN PATENT DOCUMENTS

| | | |
|---|---|---|
| EP | 1 029 651 A1 | 4/2003 |
| EP | 1 296 136 A2 | 1/2010 |

(Continued)

OTHER PUBLICATIONS

Supplementary European Search Report, EP 09734809.8, Mar. 8, 2011, Rolls-Royce Corporation.

(Continued)

*Primary Examiner* — Leo B Tentoni
(74) *Attorney, Agent, or Firm* — Krieg DeVault LLP

(57) ABSTRACT

There is disclosed stereolithographic manufacture of more complex components including at least one active material without the need for fabrication. Fabrication can introduce component discontinuities that hinder performance of the final component. Thus, some embodiments entail a method of manufacture for complex, field activated components such as piezoelectric or magnetostrictive sensors or actuators.

12 Claims, 2 Drawing Sheets

(56) References Cited

U.S. PATENT DOCUMENTS

| | | |
|---|---|---|
| 6,284,072 B1 | 9/2001 | Ryan et al. |
| 6,372,173 B1 | 4/2002 | Peschges |
| 6,423,260 B1 | 7/2002 | Chartoff et al. |
| 6,520,477 B2 | 2/2003 | Trimmer |
| 6,641,772 B2 | 11/2003 | Gelbart |
| 7,258,896 B2 | 8/2007 | Deckard et al. |
| 2001/0003031 A1* | 6/2001 | Tamura et al. ............. 264/401 X |
| 2005/0090575 A1* | 4/2005 | Chaput et al. ................. 523/115 |
| 2005/0285312 A1 | 12/2005 | Fury et al. |
| 2006/0055087 A1 | 3/2006 | Freund et al. |
| 2006/0231982 A1* | 10/2006 | You ............................... 264/496 |
| 2007/0001581 A1 | 1/2007 | Stasiak et al. |
| 2007/0067058 A1 | 3/2007 | Miyamoto et al. |
| 2008/0132597 A1* | 6/2008 | Nozawa et al. ................. 522/71 |
| 2008/0194721 A1* | 8/2008 | Arney et al. .................... 522/49 |
| 2009/0239188 A1* | 9/2009 | Ting et al. ......................... 433/2 |

FOREIGN PATENT DOCUMENTS

| | | |
|---|---|---|
| WO | WO 93/20993 A1 | 10/1993 |
| WO | PCT/US09/02321 | 4/2009 |

OTHER PUBLICATIONS

International Search Report, PCT/US2009/02321, Dec. 30, 2009, Rolls-Royce Corporation.

European Examination Report, European Patent Application No. 09734809,8, Rolls-Royce Corporation, Sep. 30, 2014 (5 pages).

* cited by examiner

MANUFACTURE OF FIELD ACTIVATED COMPONENTS BY STEREOLITHOGRAPHY

CROSS REFERENCE TO RELATED APPLICATIONS

The present patent application claims the benefit of U.S. Patent Application No. 61/124,046, filed Apr. 14, 2008, which is incorporated herein by reference.

BACKGROUND

The present invention contemplates the use of rapid prototyping and/or free form fabrication technique. One preferred free form fabrication technique is known as selective laser activation. Selective laser activation is based upon a stereolithography process that utilizes liquid resins that solidify when exposed to an energy dose. A photocurable resin has at least one monomer that is polymerized by the energy dose to form a polymer binder. The energy dose can be delivered by any of a plurality of energy sources known to those skilled in the art. Preferably, the energy dose is defined by electromagnetic radiation. Commercially available machines for selective laser activation are available from 3D systems of Valencia, Calif. Further information related to selective laser activation and stereolithography is disclosed in U.S. Pat. Nos. 5,256,340, 5,556,590, 5,571,471, 5,609,812 and 5,610,824.

SUMMARY

One embodiment of the present invention is a unique method for producing a three dimensional sensor device or actuator device. Other embodiments include apparatuses, systems, devices, hardware, methods, and combinations for field activated components. Further embodiments, forms, features, aspects, benefits, and advantages of the present application shall become apparent from the description and figures provided herewith.

BRIEF DESCRIPTION OF THE DRAWINGS

The description herein makes reference to the accompanying drawings wherein like reference numerals refer to like parts throughout the several views, and wherein.

DETAILED DESCRIPTION OF THE PREFERRED EMBODIMENTS

Figure 1:
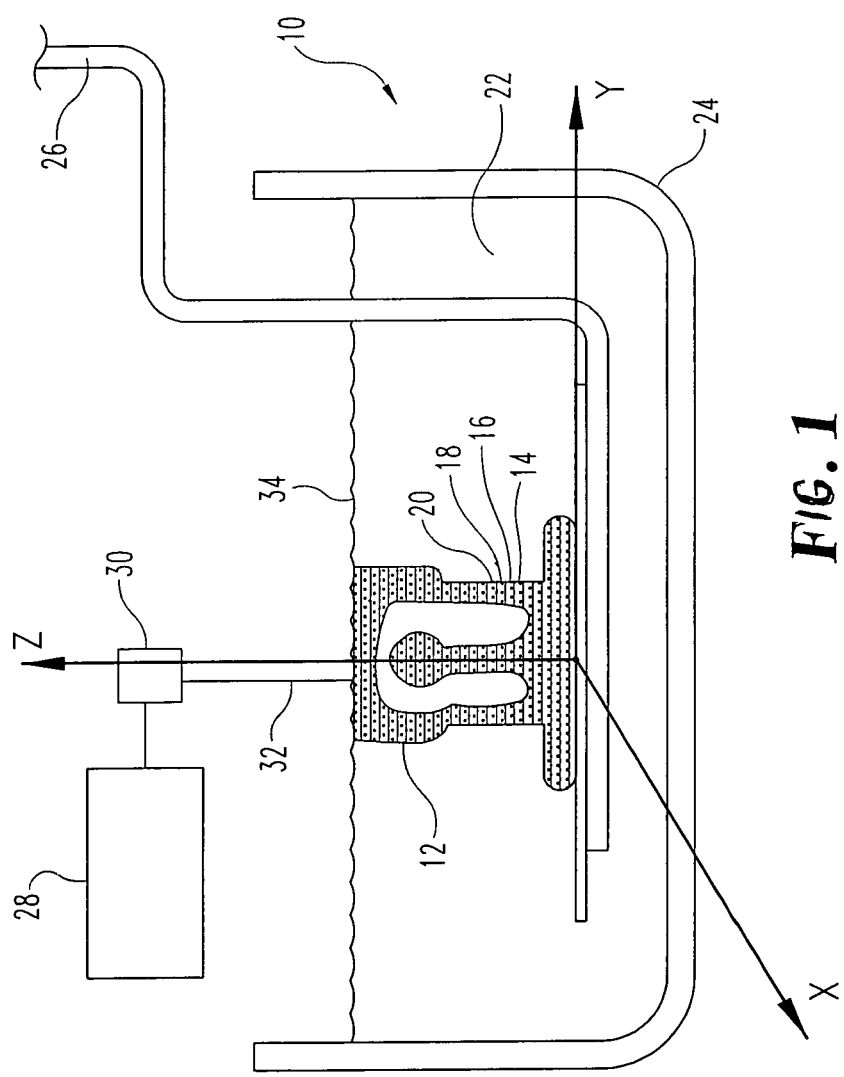
FIG. 1 is an illustrative view of one embodiment of a free form fabrication system for fabrication of a component.

For purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring to FIG. 1, there is illustrated one non-limiting embodiment of a free form fabrication system 10 for free form fabrication of an apparatus/component. In one form, system 10 is a selective laser activation (SLA) stereolithography system. Selective laser activation is based upon a stereolithography process that utilizes liquid resins that solidify when exposed to an energy dose. In one form, the resin includes active materials disposed within a photo-polymerizable monomer resin. In another form the present application contemplates the resin includes active materials disposed within a photo-polymerizable oligomer resin. The present application fully contemplates a broad range of photo-polymerizable resins including but not limited to monomer(s) and/or oligomer(s). The text of the application will generally describe the resin in terms of including monomer(s) however the present application fully contemplates that the description is equally applicable to a photo-polymerizable resin including but not limited to oligomer(s) and/or a combination of monomer(s) and oligomer(s).

The energy dose used to cure the resin may be varied. In one form, the energy does is varied by fixing a laser power and beam diameter, and then varying the laser scan speed across the resin surface. A photocurable resin has at least one monomer that is polymerized by the energy dose to form a polymer binder. The energy dose can be delivered by any of a plurality of energy sources known to those skilled in the art. In one form, the energy dose is electromagnetic radiation output by a laser. In other embodiments, other energy sources maybe employed, e.g., UV sources. The present application also contemplates that other free form manufacturing systems may be employed, such as three dimensional printing systems. The present application fully contemplates alternative curing systems such as, but not limited to, flash curing and/or a scanned cure system. One type of flash cure system is commercially available by Envisiontech and one type of scanned cure system is commercially available by Huntsman.

In one form, the apparatus fabricated by system 10 is a three dimensional field activated component/apparatus 12, such as but not limited to a sensor device, an actuator device and/or a transducer device. Component/apparatus 12 is merely illustrative and is shown being formed in stereolithography system 10 by the photo-polymerization of a photo-polymerizable active-material-laden monomer (PPAMLM) resin into layers of active particles that are held together by a polymer binder, e.g., including a layer 14, a layer 16, a layer 18 and a layer 20. In one form, each layer is on the order of 0.1 mm thick. Thinner or thicker layers may be employed in other embodiments. The present application contemplates layers of similar and/or dissimilar thickness throughout the component. It should understand that there is no intention herein to limit the present application to any particular number of layers or thickness of layers.

Stereolithography system 10 may be used to produce complex objects, such as component/apparatus 12, with a content of active material that is different than the photo-active polymer used for the build process. In one form, fine powders having particles of active materials are contemplated for use as additives to resins to form a PPAMLM resin 22. In one form the active material is more than 10% by volume of the mixture and in an alternative form the active material is within a range of 10% to 15% by volume of the mixture. In another aspect of the present application includes a mixture including about 25% by volume of the active material. Additionally, the present application contemplates a mixture having a volume of active material therein within a range of 10% to 50% and another mixture having the volume of active material greater than 50%. In one form, PPAMLM resin 22 is formed by mixing the active material powder into a monomer resin. In other embodiments, the PPAMLM resin may be formed by other suitable processes. Active materials as used herein include electrically and/or magnetically active materials. The present application contemplates that magnetic permeability is a characteristic of many forms of the active material. Active materials include, but are not limited to, magnetostrictive materials such as powders comprised of terbium, dysprosium, and/or iron and/or alloys thereof. Other examples include piezoelectric materials, such as barium titanate (BaTiO$_3$), or magnetic materials. Still other materials envisioned include carbon nanotubes or quantum dots. Active materials within the context of the present application have in common the property that they react to an applied electric, magnetic and/or electromagnetic field or wave. In some applications the active materials might also produce fields.

Stereolithography system 10 is illustrated in a simplified manner to facilitate the explanation of one method of making component/apparatus 12. In one form, the formation of the layers (e.g. 14-20) utilizes a leveling technique to level each of the layers of PPAMLM resin prior to receiving the energy used to polymerize the resin. The present application contemplates many techniques to level the resin including but not limited to: ultrasonic processing; time delay; and/or mechanically assisted sweep such a wiper blade. However, the present application also contemplates embodiments that do not utilize active techniques for leveling each of the layers prior to receiving the polymerization energy.

A three dimensional coordinate system including a first axis, a second axis and a third axis is utilized as a spatial reference for the item being fabricated, e.g., three dimensional field activated component/apparatus 12. In one form, the three dimensional coordinate system is a Cartesian coordinate system having X, Y and Z axes corresponding to the axes of stereolithography system 10. However, other three dimensional coordinate systems are contemplated herein, including but not limited to polar, cylindrical and spherical.

In one form stereolithography system 10 includes a resin containment reservoir 24, an elevation-changing member 26, a laser source 28 and a scanning device 30. Resin containment reservoir 24 is filled with a quantity of PPAMLM resin 22 from which component/apparatus 12 is fabricated. In one form, the PPAMLM resin 22 contains a photoinitiator. In another form, the PPAMLM resin 22 contains a dispersant in addition to the photoinitiator. Scanning device 30 scans a laser beam 32 from laser source 28 across the surface 34 of PPAMLM resin 22 in the desired shape to form each layer of component 12. Laser bean 32 is used to provide the energy dose to cure each layer of photocurable active material laden monomer resin 22 at and near the surface 34 of PPAMLM resin 22. An overcure of each layer binds the current layer to the previous layer. The successively formed cured layers ultimately form the three dimensional shape of component/apparatus 12.

In one form, component/apparatus 12 is a functional three dimensional object as-produced by stereolithography system 10 in one form. Alternatively, it is contemplated that in other embodiments, component/apparatus 12 may be subject to additional processing, such as burnout and/or sintering, prior to use. In one form, PPAMLM resin 22 includes sufficient quantities of active material to yield greater than 50% by volume active material in component 12, e.g., before and/or after burnout and/or sintering. In another form the resin includes sufficient quantities of active material to yield about 50% by volume of active material in the component after burnout and sintering. The present application contemplates a wide varity of active material volume loading within the sintered component and is not limited to the directly previous ranges unless specifically provided to the contrary.

Component/apparatus 12 is illustrated in FIG. 1 as being fabricated layer by layer in stereolithography system 10. The layers have a thickness in the direction of axis Z, which is referred to as the build direction. Component/apparatus 12 is built at a build orientation angle as measured from axis Z. The build orientation angle illustrated in FIG. 1 is zero degrees. Other build orientation angles are fully contemplated herein. The three dimensional coordinate system is aligned with the build orientation angle. In one form the three dimensional coordinate system of the item being fabricated and the stereolithography system 10 coordinate system are coextensive.

Figure 2:
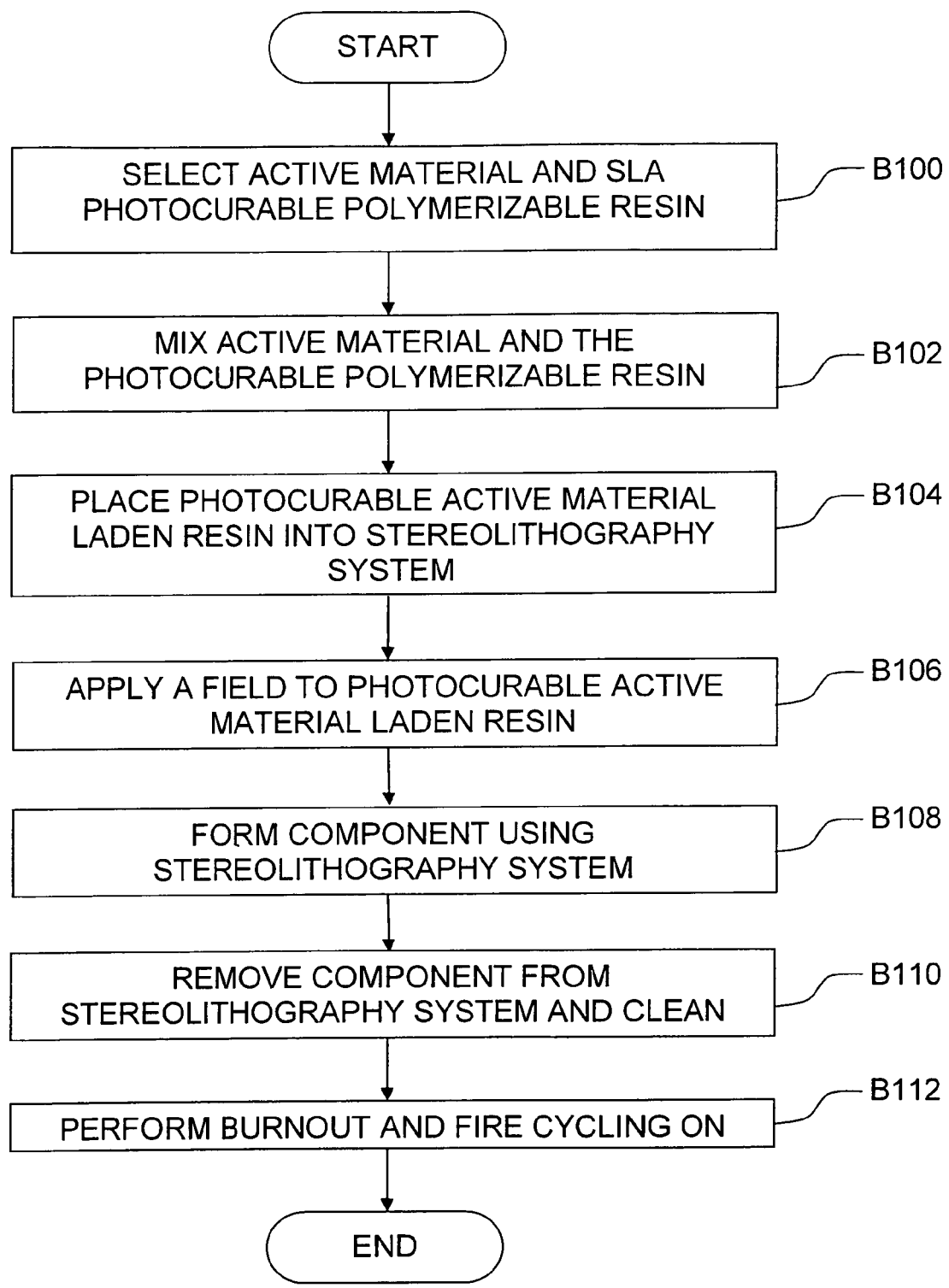
FIG. 2 is a flow chart illustrating one method of forming a component utilizing aspects of the present invention.

Referring now to FIG. 2, a method of manufacturing component/apparatus 12 in accordance with an embodiment of the present invention is depicted. In one form, component/apparatus 12 is a sensor for magnetostrictive behavior. Other active component types may be manufactured in other embodiments, for example, other types of sensor devices, actuator devices and/or transducer devices.

At block B100, an active material and a photocurable polymerizable resin are selected. The selection of the active material is based on the desired properties of the desired component/apparatus, e.g., component 12. In one form, the active material is a magnetostrictive material in powder form, and the photocurable polymerizable resin includes a photoinitator and a dispersant.

At block B102, the active material and the photocurable polymerizable resin are mixed to form PPAMLM resin 22. In one form, PPAMLM resin 22 is more than 50% active material by volume. However, the present application contemplates that the active material can form other % by volume of the mixture including but not limited to the following: more than about 10% by volume of the mixture; within a range of about 10% to about 15% by volume of the mixture; about 25% by volume of the mixture; within a range of about 10% to about 50% of the mixture.

At block B104, PPAMLM resin 22 is placed into stereolithography system 10, e.g., into fluid/resin containment reservoir 24. In one form, PPAMLM resin 22 is continually mixed while in resin containment reservoir 24 in order to keep the active material uniformly distributed in the photocurable polymerizable resin. In other embodiments, mixing may not be required.

At block B106, a field is applied to PPAMLM resin 22. In one form, the field is an electric field. In another form, the field is a magnetic field. In still another form, the field is an electromagnetic field. The field may be used to bring the suspended particles of active material into a desired alignment. In one form, the field is constant. In another form, the field is intermittent. In yet another form, the field is variable, e.g., varies in magnitude and/or frequency.

In one form, the field is applied to PPAMLM resin 22 while it resides in resin containment reservoir 24. In another form, the field may be applied after component/apparatus 12 is formed. In yet another form, the field may be applied after burnout or sintering of component/apparatus 12. In still another form, block B106 is not performed, that is, no field is applied as part of manufacturing component/apparatus 12. At block B108, component/apparatus 12 is formed using stereolithography system 10.

At block B110, component/apparatus 12 is removed from stereolithography system 10 and preferably is cleaned. In addition, in one form, any support structure removal is performed.

At block B112, component/apparatus 12 is subject to burnout heating to remove the polymer. Component/apparatus 12 may then be subject to a fire cycle to sinter the material. In other embodiments, component/apparatus 12 may be employed in the green condition e.g., without being subject to burnout and fire cycle processing. In still other embodiments component/apparatus 12 may be subject to hot pressing, e.g., a hot isostatic press, for example, prior to, during and/or after burnout and fire cycle processing.

A wide variety of components/apparatus made with active materials are contemplated as within the scope of the present application, such as sensors, actuators or other functional components. Such components/apparatus may include, but are not limited to, acoustic arrays, antennas and transducers that can be produced with the enhanced dimensional opportunities available through SLA and other free form manufacturing processes. It should be understood that such components/apparatus might preferably include a combination of one or more active materials and one or more inactive materials.

As another non-limiting example, three dimensional components/apparatus produced in accordance with embodiments of the present invention might find use in a remote sensing application. As one example, a probe beam might elicit a response from such a component/apparatus. More explicitly and by way of further example, the active material of the component/apparatus may include carbon nanotubes, as well as field-generating materials such as magnetostrictive materials and/or piezoelectric materials and/or electro-restrictive materials. A laser pulse may be used to excite the nanotubes in a composite. The nanotubes would heat up thus generating a strain on surrounding magnetostrictive and/or piezoelectric particles. The magnetostrictive and/or piezoelectric particles would then generate one or more fields that could be remotely sensed.

Formation of complex geometries may be desirable in the context, for example, of sensors and actuators, where component/apparatus geometry can greatly impact performance. Some embodiments of the present invention may allow component/apparatus geometries which have previously been difficult or impossible to manufacture without assembly. The layer by layer build may permit varying physical properties throughout the component/apparatus as desired. As one example, such varying physical properties might result from layers that omit active materials, or layers that include differing percentages or types of active materials. Alternatively, such varying physical properties could result from the imposition of constant or varying electric or magnetic fields during the layer by layer manufacturing process.

Various embodiments of the present invention may allow complex components/apparatus to be manufactured without the need for fabrication. Fabrication can introduce component/apparatus discontinuities that hinder performance of the final component. Thus, some embodiments entail a method of manufacture for complex, field activated components such as piezoelectric or magnetostrictive sensors and actuators. As an example, one embodiment of the manufacture of a sensor for magnetostrictive behavior is manufactured by the method described herein. It should be understood that other variations according to the precepts discussed herein are contemplated as within the scope of the invention.

Rapid prototyping processes allow the formation of complex shapes. The SLA process and derivatives may be used to produce solid objects with greater than 50% by volume material that is different than the photo-active polymer used for the build process. As an example, ceramics are added to SLA resins to allow three dimensional composites to be built in an SLA machine. Such three dimensional composites are subsequently processed into functional ceramic objects.

The present invention describes an extension to use of the SLA process with ceramic loaded resins. Specifically, resins loaded with other materials are contemplated as within the scope of the present invention. In particular, preferably fine powders of active materials are contemplated for use as additives to SLA resins. Active materials as used herein includes electrically and/or magnetically active materials. Such materials include, but are not limited to, magnetostrictive materials such as powders comprised of alloys of terbium, dysprosium, and/or iron. Other examples include piezoelectric materials such as barium titanate ($BaTiO_3$), or magnetic materials. Still other materials envisioned include carbon nanotubes or quantum dots. These active materials have in common the property that they react to an applied electric, magnetic or electromagnetic field or wave. In many applications these materials might also produce fields.

A wide variety of apparatus including active materials are contemplated as within the scope of the invention such as sensors, actuators or other functional components. Such apparatus include, but are not limited to, acoustic arrays, antennas and transducers that can be produced with the enhanced dimensional opportunities available through the SLA process. It should be understood that such apparatus might preferably include a combination of one or more active materials and one or more inactive materials.

As another non-limiting example, three dimensional objects produced using a rapid prototyping process according to the present invention, so as to include at least one active material, might find use in an apparatus for a remote sensing application. As one example, a probe beam might elicit a response from such an apparatus. More explicitly and by way of further example, a laser pulse could excite the nanotubes in a composite. The nanotubes would heat up thus generating a strain on the surrounding particles. Other particles in the matrix would then generate a field that could be remotely sensed.

The present invention relates to the addition of "active" particles to a photosensitive resin with the intent of producing functional three dimensional objects via the SLA or similar process. The added "active" material reacts to or produces electric, magnetic or electromagnetic fields. In one form the mixture of the resin and any added material is greater than 50% by volume different than the photo-active polymer used for the build process. Such functional three dimensional objects might be used as produced from the SLA machine, or after additional processing such as burnout or sintering.

This method of manufacture permits the formation of complex geometries not possible by other methods. The current manufacturing processes for components including active materials are varied but remain in what is seen as conventional manufacturing routes (hot pressing, sintering, powder processing, etc.) Formation of complex geometries is of no small importance in the context, for example, of sensors and actuators where component geometry can greatly impact performance. This method of manufacture has been shown to allow component geometries which have previously been difficult or impossible to manufacture without assembly. The layer by layer build permits varying physical properties throughout the component as desired. As one example, such varying physical properties might result from layers that omit active materials, or layers that include differing percentages or types of active materials. Alternatively, as further discussed below, such varying physical properties could result from the imposition of constant or varying electric or magnetic fields during the layer by layer manufacturing process.

Various embodiments of the present invention allow more complex components to be manufactured without the need for fabrication. Fabrication can introduce component discontinuities that hinder performance of the final component. Thus, some embodiments entail a method of manufacture for complex, field activated components such as piezoelectric or magnetostrictive sensors and actuators. As an example, one embodiment of the manufacture of a sensor for magnetostrictive behavior is manufactured by the method described below. It should be understood that other variations according to the precepts discussed herein are contemplated as within the scope of the invention.

A (preferably fine) powder of the chosen material is manufactured. The material choice is dictated by the required properties of the final component. The powder is mixed into a resin, preferably a monomer resin. The resin contains a photoinitiator and dispersant in the required quantities. In one form this mixture is more than 50% by volume of the (electrically and/or magnetically) active material. The resin mix is placed into a Stereolithography machine and a component is manufactured. The components manufactured in this manner are then removed from the SLA machine and any cleaning and further processing is undertaken.

Variations on this base method are also contemplated as within the scope of the invention. For example, it may be preferable (or even necessary depending on the requirements for the component) to apply a constant, intermittent, or variable magnetic or electric field to the resin during the processing in the SLA machine. Alternatively this field may be unnecessary to produce the required component, or it may be applied at another time in the manufacturing process. Further, it should be understood that in some applications a component that has the polymer removed is desirable, and a burnout and fire cycle will be undertaken. However, in other applications the 'green' component may be adequate for the application chosen.

In one embodiment of the present invention there is a method of producing a three dimensional sensor device or actuator device. A powder of an active material is mixed into a monomer resin containing a photoinitiator and dispersant. The mixture is used in a stereolithography process to form a three dimensional device having at least one of piezoelectric or magnetostrictive behavior.

In one refinement of the embodiment the active material powder is added to the resin to form more than 50% by volume of the mixture.

In another refinement of the embodiment at least one of an electric field and a magnetic field is applied to the resin during the stereolithography process.

In another refinement of the embodiment the field is applied intermittently during the stereolithography process.

In another refinement of the embodiment the field is varied during the stereolithography process.

In another refinement of the embodiment an field is applied to the resin during the stereolithography process.

In another refinement of the embodiment the field is a constant field during the stereolithography process.

In another refinement of the embodiment after the stereolithography processing the device is cleaned.

In another refinement of the embodiment after the stereolithography processing the device is subject to a burnout and fire cycle.

In another refinement of the embodiment the powder includes at least one active material selected from the group consisting of terbium, dysprosium, and iron.

In another refinement of the embodiment the powder includes at least one piezoelectric material.

In another refinement of the embodiment the powder includes at least one active material selected from the group consisting of carbon nanotubes and quantum dots.

In another embodiment of the invention there is an apparatus comprising an integrally formed three dimensional field activated component resulting from a stereolithography process containing more than 10% by volume of an active material added to a photo-active polymer.

In one refinement of the embodiment the apparatus has a complex geometry that could not be manufactured by conventional techniques without assembly.

In another refinement of the embodiment, the active material is a magnetostrictive material. In another refinement, the magnetostrictive material includes at least one material selected from the group consisting of an alloy of terbium, an alloy of dysprosium, and an alloy of iron.

In another refinement of the embodiment the active material includes at least one of a piezoelectric material and a magnetic material.

In another refinement of the embodiment the piezoelectric material is barium titanate.

In another refinement of the embodiment the active material includes carbon nanotubes.

In another refinement of the embodiment the active material includes a quantum dot.

In another refinement of the embodiment the active material is selected from the group consisting of: an alloy of terbium, an alloy of dysprosium, an alloy of iron, a piezoelectric material, a carbon nanotube, and a quantum dot.

In another refinement of the embodiment the apparatus is a sensor.

In another refinement of the embodiment the apparatus is an actuator.

In another refinement of the embodiment the apparatus is an acoustic array.

In another refinement of the embodiment the apparatus is an antenna.

In another refinement of the embodiment the apparatus is a transducer.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

What is claimed is:

1. A method of producing a three dimensional sensor device or actuator device comprising:
    mixing a powder of an active material into a monomer or oligomer resin containing a photoinitiator and a dispersant to form a mixture, wherein the active material includes
        an electrostrictive material and a combination of a piezoelectric material and carbon nanotubes, or
        a combination of a piezoelectric material and carbon nanotubes; and
    using a stereolithography process, including providing an energy dose to the mixture of active material and resin to polymerize the mixture, to form a three dimensional device having a piezoelectric and/or electrostrictive behavior.

2. The method of claim 1, wherein the active material powder is added to the resin to form more than 50% by volume of the mixture.

3. The method of claim 1, further comprising applying an electric field to the mixture during the stereolithography process.

4. The method of claim 3, wherein the electric field is applied intermittently during the stereolithography process.

5. The method of claim 3, wherein the electric field is varied during the stereolithography process.

6. The method of claim 3, wherein the electric field is a constant field during the stereolithography process.

7. The method of claim 1, wherein after performance of the stereolithography process the device is cleaned.

8. The method of claim 1, wherein after performance of the stereolithography process the device is subject to a burnout and fire cycle.

9. The method of claim 1, wherein the powder includes at least one active material selected from the group consisting of carbon nanotubes and quantum dots.

10. The method of claim 1, wherein the resin is a monomer.

11. A method of producing a three dimensional sensor device or actuator device comprising:
  mixing a powder of an active material into a monomer or oligomer resin containing a photoinitiator and a dispersant to form a mixture, wherein the active material includes
    an electrostrictive material and a combination of a piezoelectric material and carbon nanotubes, or
    a combination of a piezoelectric material and carbon nanotubes; and
  using the mixture in a stereolithography process to form a three dimensional device having a piezoelectric and/or electrostrictive behavior.

12. A method of producing a three dimensional sensor device or actuator device comprising:
  mixing a powder of an active material into a monomer or oligomer resin containing a photoinitiator and a dispersant to form a mixture, wherein the active material includes
    an electrostrictive material and/or a combination of a piezoelectric material and carbon nanotubes; and
  using a stereolithography process, including providing an energy dose to the mixture of active material and resin to polymerize the mixture, to form a three dimensional device having a piezoelectric and/or electrostrictive behavior.

* * * * *